(12) United States Patent
Park et al.

(10) Patent No.: US 9,309,405 B2
(45) Date of Patent: Apr. 12, 2016

(54) NANOFIBER-NANOWIRE COMPOSITE AND FABRICATION METHOD THEREOF

(75) Inventors: Jong-jin Park, Yongin-si (KR); Seung-nam Cha, Yongin-si (KR); Jae-hyun Hur, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 798 days.

(21) Appl. No.: 12/801,888

(22) Filed: Jun. 30, 2010

(65) Prior Publication Data

US 2011/0177332 A1    Jul. 21, 2011

(30) Foreign Application Priority Data

Jan. 15, 2010  (KR) .................... 10-2010-0003933

(51) Int. Cl.
  *B32B 1/00* (2006.01)
  *C08L 71/02* (2006.01)
  *D01F 1/10* (2006.01)
  (Continued)

(52) U.S. Cl.
  CPC .............. *C08L 71/02* (2013.01); *B29C 47/0021* (2013.01); *D01F 1/10* (2013.01); *B29C 47/0004* (2013.01); *B29C 47/0014* (2013.01); *B29C 47/1045* (2013.01); *B29C 47/1063* (2013.01); *B29C 47/64* (2013.01); *B29C 47/76* (2013.01); *B29K 2009/00* (2013.01); *B29K 2023/16* (2013.01); *B29K 2025/00* (2013.01); *B29K 2055/02* (2013.01); *B29K 2105/0005* (2013.01); *B29K 2105/12* (2013.01); *D01D 5/0007* (2013.01); *G03F 7/0047* (2013.01); *G03F 7/038* (2013.01); *Y10T 428/2913* (2015.01)

(58) Field of Classification Search
  CPC ... D01D 5/0007; D01F 1/10; Y10T 428/2913
  USPC .............. 428/364; 430/325; 264/465; 117/94
  See application file for complete search history.

(56) References Cited

U.S. PATENT DOCUMENTS 4,008,344 A * 2/1977 Okamoto et al. ............. 428/374
2005/0064185 A1* 3/2005 Buretea et al. ............... 428/364
(Continued)

FOREIGN PATENT DOCUMENTS

KR          10-0666477 A    1/2007
KR   10-2007-0017319 A    2/2007
(Continued)

OTHER PUBLICATIONS

Da-Peng Liu, et al., *Highly Luminescent ZnO Nanocrystals Stabilized by Ionic-Liquid Components*, Angew. Chem. Int. Ed., p. 730-7373 (2006).

(Continued)

*Primary Examiner* — Peter Y Choi
*Assistant Examiner* — Vincent A Tatesure
(74) *Attorney, Agent, or Firm* — Harness, Dickey & Pierce, P.L.C.

(57) ABSTRACT

Example embodiments are directed to a nanofiber-nanowire composite includes a polymer nanofiber; and a plurality of nanowires of a metal oxide extending from inside to outside of the polymer nanofiber and covering the polymer nanofiber. According to example embodiments, a method of fabricating a nanofiber-nanowire composite includes forming a nanofiber including a metal seed; and growing nanowires of a metal oxide from the metal seed to the outside of the nanofiber.

17 Claims, 5 Drawing Sheets

(51) Int. Cl.

| | | |
|---|---|---|
| B29C 47/00 | (2006.01) | |
| B29C 47/10 | (2006.01) | |
| B29C 47/64 | (2006.01) | |
| B29C 47/76 | (2006.01) | |
| B29K 9/00 | (2006.01) | |
| B29K 23/00 | (2006.01) | |
| B29K 25/00 | (2006.01) | |
| B29K 55/02 | (2006.01) | |
| B29K 105/00 | (2006.01) | |
| G03F 7/004 | (2006.01) | |
| G03F 7/038 | (2006.01) | |
| B29K 105/12 | (2006.01) | |
| D01D 5/00 | (2006.01) | |

(56) References Cited

U.S. PATENT DOCUMENTS

| | | | |
|---|---|---|---|
| 2007/0018361 A1* | 1/2007 | Xu | 264/465 |
| 2007/0116640 A1 | 5/2007 | Kim et al. | |
| 2008/0170982 A1* | 7/2008 | Zhang et al. | 423/447.3 |
| 2008/0274403 A1 | 11/2008 | Kim et al. | |
| 2009/0148701 A1 | 6/2009 | Wendorff et al. | |

FOREIGN PATENT DOCUMENTS

| | | |
|---|---|---|
| KR | 10-0836627 B1 | 6/2008 |
| KR | 10-0868290 A | 11/2008 |

OTHER PUBLICATIONS

Xudong Wang, et al., *Direct-Current Nanogenerator Driven by Ultrasonic Waves,* Science, vol. 316, p. 102-105 (Apr. 6, 2007).

Yong Qin, et al., *Mircrofibre-nanowire hybrid structure for energy scavenging,* Nature, vol. 451, p. 809-813 (Feb. 14, 2008).

Johann Cho, et al., "Nanostructured carbon nanotube/$TiO_2$ composite coatings using electrophoretic deposition (EDP)", *J Nanopart Res,* vol. 10, p. 99-105 (2008).

Alessio Becheri, et al., *Synthesis and characterization of zinc oxide nanoparticles: application to textiles as UV-absorbers,* J Nanopart Res, vol. 10, p. 679-689 2008.

Xiaomeng Sui, et al., *Photoluminescence of polyethylene oxide—ZnO composite electrospun fibers,* Science Direct, Polymer Communication, Polymer 48, p. 1459-1463 (2007).

\* cited by examiner

NANOFIBER-NANOWIRE COMPOSITE AND FABRICATION METHOD THEREOF

CROSS-REFERENCE TO RELATED APPLICATIONS

This application claims benefit under 35 U.S.C. §119 to Korean Patent Application No. 10-2010-0003933, filed on Jan. 15, 2010, in the Korean Intellectual Property Office, the disclosure of which is incorporated herein in its entirety by reference.

BACKGROUND

1. Field

Example embodiments relate to a nanofiber-nanowire composite fabricated by growing nanowires of a metal oxide from a polymer nanofiber and a method of fabricating the nanofiber-nanowire composite.

2. Description of the Related Art

A nanofiber is an ultra fine fiber having a very small diameter of about 1 μm or less and can be used in materials for medical purposes, filters, microelectro-mechanical system (MEMS), nano devices, etc. A nanofiber has a large surface area per unit mass, is flexible, and fine spaces. A nanofiber may be easily blended with another material and can distribute external stress exerted thereon.

One method of fabricating nanofiber is electrospinning. An electrospinning device includes a spinning tip through which a solution for electrospinning is supplied, a high-voltage device, and a collector for collecting nanofiber. A high voltage is applied to the spinning tip to charge droplets of the solution supplied via the spinning tip, and a stream of the droplets is emitted by electrostatic repulsion to form nanofiber on the collector.

In addition, nanofiber may be fabricated using a microfluidic technique. Nanofiber having a core-shell structure may be fabricated using a device including an injection tube and a collection tube by which a middle fluid and an outer fluid, which are different from each other, are emitted by external pressure.

Since nanofiber has a very large surface area, the surface of the nanofiber may be used in various ways. For example, nanofiber may be used to prepare functional nano devices. For example, a nanowire may be formed from the nanofiber to prepare an elastic electrode. Functional nano devices may be applied to stretchable electronics, wearable devices, and the like.

SUMMARY

According to example embodiments, a nanofiber-nanowire composite includes a polymer nanofiber; and a plurality of nanowires of a metal oxide extending from inside to outside of the polymer nanofiber and covering the polymer nanofiber.

According to example embodiments, the polymer nanofiber includes a water-insoluble polymer.

According to example embodiments, the water-insoluble polymer is prepared by cross-linking a water-soluble polymer.

According to example embodiments, the water-insoluble polymer is a multi-functional resin.

According to example embodiments, the water-soluble polymer includes at least one selected from a group consisting of polyvinyl alcohol (PVA), polyacrylic acid (PAA), polystyrene sulfonic acid, polyhydroxyethyl methacrylate, polyethylene oxide (PEO), polyvinyl pyrrolidone (PVP), polyacrylamide (PA), PVA-PEO-PVA, PVA-poly propylene oxide (PPO)-PVA, PVA-PA, PVA-PA-PAA, PVA-polystyrene (PS)-PVA, and PVA-PVA, PVA-SbQ prepared by introducing a stilbazolium group to PVA, and polyethylene glycol diacrylate.

According to example embodiments, the polymer nanofiber further includes an elastic binder.

According to example embodiments, the polymer nanofiber further includes a conductive material.

According to example embodiments, the conductive material includes a nano metal particle, an ionic liquid, or an ionomer.

According to example embodiments, the metal oxide includes zinc oxide (ZnO), tin-dioxide (SnO2), titanium dioxide (TiO2), or indium oxide (In2O3).

According to example embodiments, the polymer nanofiber has a core-shell structure.

According to example embodiments, a method of fabricating a nanofiber-nanowire composite includes forming a nanofiber including a metal seed; and growing nanowires of a metal oxide from the metal seed to the outside of the nanofiber.

According to example embodiments, forming the nanofiber includes forming a polymer film by spin coating a composition including a photosensitive polymer, a precursor of the metal oxide, and a solvent; and patterning the nanofiber by exposing the polymer film to light using a photomask and developing the polymer film.

According to example embodiments, forming the nanofiber includes forming a pre-nanofiber by electrospinning a composition including a water-soluble polymer, a first precursor of the metal oxide, and a solvent; and converting the water-soluble polymer in the pre-nanofiber into a water-insoluble polymer by cross-linking the water-soluble polymer.

According to example embodiments, the water-soluble polymer is cross-linked by heat-treatment.

According to example embodiments, the water-soluble polymer is cross-linked by UV-radiation.

According to example embodiments, growing the nanowires of the metal oxide includes immersing the nanofiber in a hexamethyltetradiamine (HMTA, (CH2)6N4) solution.

According to example embodiments, growing the nanowires of the metal oxide further includes adding a second precursor of the metal oxide to the HMTA solution in which the nanofiber is immersed.

According to example embodiments, growing the nanowires of the metal oxide includes heating the nanofiber in a mixed solution including zinc acetate, deionized water, and methanol; and adding a solution including potassium hydroxide and methanol into the mixed solution.

According to example embodiments, the composition further includes a conductive material.

According to example embodiments, the metal oxide includes zinc oxide (ZnO), tin-dioxide (SnO2), titanium dioxide (TiO2), or indium oxide (In2O3).

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1A:
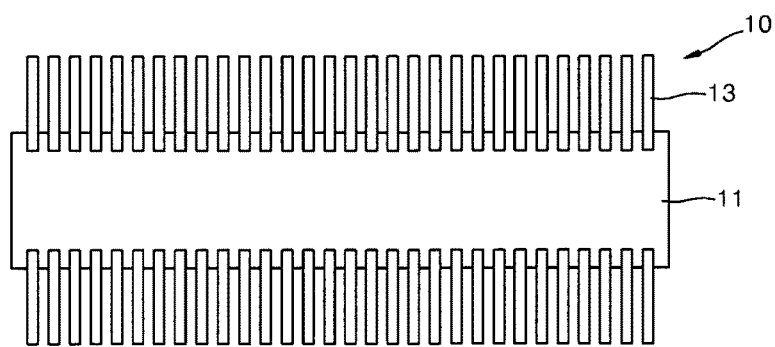
FIG. 1A is a longitudinal sectional view of a nanofiber-nanowire composite in which nanowires of a metal oxide extend from the inside to the outside of a nanofiber.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1B:
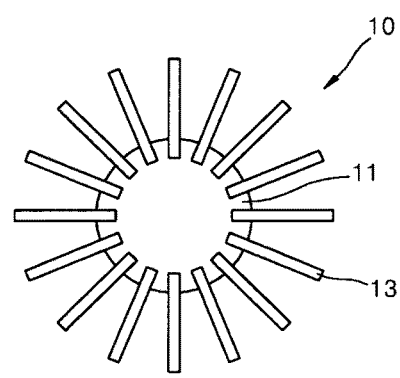
FIG. 1B is a cross sectional view of the nanofiber-nanowire composite of FIG. 1A according to example embodiments.

FIG. 1A is a longitudinal sectional view of a nanofiber-nanowire composite 10 in which nanowires of a metal oxide 13 extend from the inside to the outside of a nanofiber 11, and FIG. 1B is a cross sectional view of the nanofiber-nanowire composite 10 of FIG. 1A, according to example embodiments.

Referring to FIGS. 1A and 1B, in the nanofiber-nanowire composite 10, the nanowires 13 extend radially from the inside to the outside of the nanofiber 11 cover the surface of the nanofiber 11. The nanowires 13 are not attached to the surface of the nanofiber 11, but one end of each nanowire 13 is planted in the body of the nanofiber 11. Thus, the nanowires 13 are rigidly supported by the nanofiber 11, and durability of the nanofiber-nanowire composite 10 may be improved.

The nanofiber 11 of the nanofiber-nanowire composite 10 may be formed of a polymer. The nanofiber 11 may be formed of a water-insoluble polymer that is obtained from a water-soluble polymer by cross-linking the water-soluble polymer by heat-treatment and/or UV-radiation. Alternatively, the nanofiber 11 may be formed of a water-insoluble photosensitive polymer such as a multi-functional resin.

A water-soluble polymer that is thermally curable may be polyvinyl alcohol (PVA), polyacrylic acid (PAA), polystyrene sulfonic acid, polyhydroxyethyl methacrylate, polyethylene oxide (PEO), polyvinyl pyrrolidone (PVP), polyacrylamide (PA), and/or the like. The water-soluble polymer that is thermally curable may also be a block copolymer such as PVA-PEO-PVA, PVA-poly propylene oxide (PPO)-PVA, PVA-PA, PVA-PA-PAA, PVA-polystyrene (PS)-PVA, and/or PVA-PVA. Meanwhile, the water-soluble polymer that is thermally cured to become a water-insoluble polymer may be carboxy methyl cellulose, methyl cellulose, hydroxy ethyl cellulose, dextrine, and/or the like. A polymer that is photo curable by UV-radiation may be PVA-SbQ prepared by introducing a stilbazolium group to PVA, polyethylene glycol diacrylate, and/or the like. That is, the nanofiber 11 may be formed of a water-insoluble polymer that is obtained by thermally curing or photo curing the water-soluble polymer.

The nanofiber 11 may further include an elastic binder. Due to the elastic binder, the elasticity of the nanofiber-nanowire composite 10 may be further improved. The elastic binder may include natural rubber, styrene butadiene rubber, polybutadiene rubber, chloroprene rubber, acrylonitrile butadiene rubber (NBR), isobutylene isoprene rubber, ethylene propylene diene rubber (DPDM), chlorosulphonated polyethylene, acrylic elastomer, fluoro elastomer, silicone elastomer, and/or polyurethane.

In addition, the nanofiber 11 may include a conductive material such as a nano metal particle, an ionic liquid, and/or an ionomer. The nano metal particle may be a nano particle of one selected from the group consisting of gold (Au), silver (Ag), copper (Cu), palladium (Pd), platinum (Pt), Ag/Pd, and aluminum (Al). The nano metal particle may have a particle size in the range of about 5 to about 10 nm. The amount of the nano metal particle may be in the range of about 10 to about 70 parts by weight, for example, about 20 to about 60 parts by weight, based on 100 parts by weight of the nanofiber polymer.

The ionic liquid refers to a salt having liquid properties at room temperature, and may also refer to a molten salt. The ionic liquid includes organic cations and/or inorganic or organic anions and has high evaporation temperature, high ionic conductivity, excellent heat resistance, and excellent flame retardant properties.

A cation of the ionic liquid may be substituted or unsubstituted imidazolium, pyrazolium, triazolium, thiazolium, oxazolium, pyridazinium, pyrimidinium, pyrazinium, ammonium, phosphonium, guanidinium, euronium, thioeuronium, pyridinium, and/or pyrrollium.

The anion may be any organic or inorganic anion that binds to the cation to form the ionic liquid. For example, the anion may include at least one selected from the group consisting of a halide anion, a borate anion, a phosphate anion, a phosphinate anion, an imide anion, a sulphonate anion, an acetate anion, a sulfate anion, a cyanate anion, a thiocyanate anion, a carbonaceous anion, a complex anion, and $ClO_4-$.

Examples of the anion include at least one selected from the group consisting of $PF_6-$, $BF_4-$, $B(C_2O_4)-$, $CH_3(C_6H_5)SO_3-$, $(CF_3CF_2)_2PO_2-$, $CF_3SO_3-$, $CH_3SO_4-$, $CH_3(CH_2)_7SO_4-$, $N(CF_3SO_2)_2-$, $N(C_2F_5SO_2)_2-$, $C(CF_2SO_2)_3-$, $AsF_6-$, $SbF_6-$, $AlCl_4-$, $NbF_6-$, $HSO_4-$, $ClO_4-$, $CH_3SO_3-$, and $CF_3CO_2-$.

The ionomer may include an ethylene acrylic acid copolymer, a polyurethane ionomer having a polytrimethylene oxide bond, and an α-olefin copolymer ionomer having ethylene, propylene, 1-butene, 1-pentene, 1-hexene, 1-heptene, 3-methyl-1-butene, or 4-methyl-1-pentene as α-olefin.

The amount of the ionic liquid or ionomer may be in the range of about 10 to about 70 parts by weight, for example, about 20 to about 60 parts by weight, based on 100 parts by weight of the nanofiber polymer.

The nanowires 13 of the nanofiber-nanowire composite 10 may be formed of a conductive metal oxide. For example, the nanowires 13 may be formed of zinc oxide (ZnO), tin-dioxide ($SnO_2$), titanium dioxide ($TiO_2$), and/or indium oxide ($In_2O_3$). The zinc oxide (ZnO) is an n-type semiconductor having a direct bandgap of about 3.3 eV and is used in electronic devices. The tin-dioxide ($SnO_2$), titanium dioxide ($TiO_2$), and/or indium oxide ($In_2O_3$) are used in electronic optoelectronic fields due to their electrical and optical properties.

The nanofiber 11 may have a diameter in the range of about 100 nm to about 5 μm, and a length of equal to or greater than 1 μm. The nanowire 13 may have a diameter in the range of about 100 nm to about 5 μm, and a length in the range of about 0.1 to about 5 μm.

The nanofiber-nanowire composite 10 may be used as a functional nano device such as an elastic electrode since flexibility, elasticity, and large surface area of the nanofiber 11 and electrical properties of the nanowire 13 are combined. Meanwhile, since the nanowires 13 are rigidly fixed from the inside of the nanofiber 11, the nanofiber-nanowire composite 10 has excellent durability.

Figure 2A:
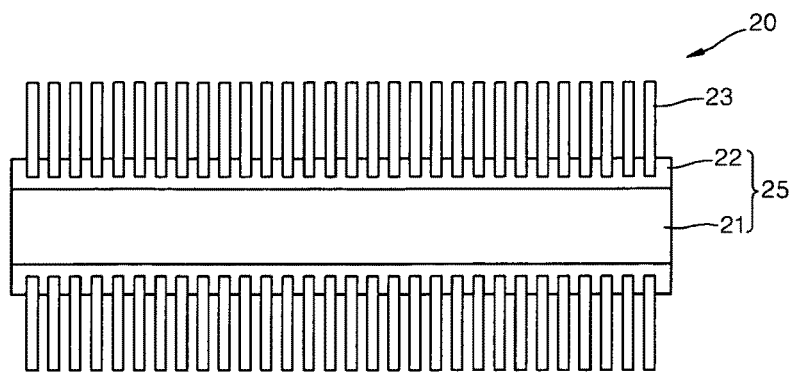
FIG. 2A is a longitudinal sectional view of a nanofiber-nanowire composite in which nanowires of a metal oxide extend from the inside to the outside of a nanofiber having a core-shell structure.

FIG. 2A is a longitudinal sectional view of a nanofiber-nanowire composite 20 in which nanowires of a metal oxide 23 extend from the inside to the outside of nanofiber shell 21. The nanofiber 25 has a nanofiber core 21 and a nanofiber shell 22 surrounding the nanofiber core 21 having a core-shell structure, and FIG. 2B is a cross sectional view of the nanofiber-nanowire composite 20 of FIG. 2A, according to example embodiments.

Figure 2B:
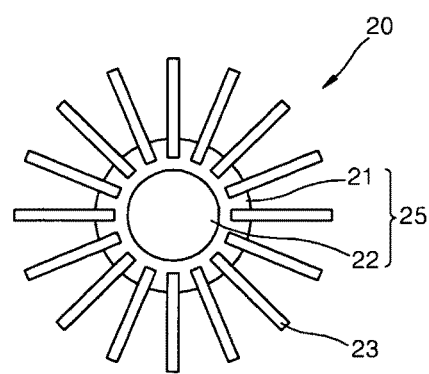
FIG. 2B is a cross sectional view of the nanofiber-nanowire composite of FIG. 2A according to example embodiments.

Referring to FIGS. 2A and 2B, in the nanofiber-nanowire composite 20, like the nanofiber-nanowire composite 10 of FIGS. 1A and 1B, the nanowires 23 extend radially from the inside to the outside of the nanofiber shell 21 that covers the surface of the nanofiber shell 21.

The nanofiber core 21 of the nanofiber 25 may be formed of a first polymer, and the nanofiber shell 22 may be formed of a second polymer. A nanofiber having a core-shell structure may have a hydrophobic surface if desired or may be used to form a p-n junction in which a bandgap is adjusted.

In FIGS. 2A and 2B, the nanowires 23 extend from the nanofiber shell 22. However, the nanowires 23 may also extend from the nanofiber core 21.

The nanofiber core 21 and the nanofiber shell 22 may each be formed of a water-insoluble polymer formed as a result of cross-linking of a water-soluble polymer. In particular, the nanofiber core 21 and the nanofiber shell 22 may be formed of the water-insoluble polymer formed as a result of cross-linking of the water-soluble polymer by heat-treatment or UV-radiation. Alternatively, the nanofiber core 21 and the nanofiber shell 22 may be formed of a water-insoluble photosensitive polymer such as a multi-functional resin.

A water-soluble polymer that is thermally curable may be polyvinyl alcohol (PVA), polyacrylic acid (PAA), polystyrene sulfonic acid, polyhydroxyethyl methacrylate, polyethylene oxide (PEO), polyvinyl pyrrolidone (PVP), polyacrylamide (PA), and/or the like. The water-soluble polymer that is thermally curable may also be a block copolymer such as PVA-PEO-PVA, PVA-poly propylene oxide (PPO)-PVA, PVA-PA, PVA-PA-PAA, PVA-polystyrene (PS)-PVA, and/or PVA-PVA. Meanwhile, the water-soluble polymer that is thermally cured to become a water-insoluble polymer may be carboxy methyl cellulose, methyl cellulose, hydroxy ethyl cellulose, dextrine, and/or the like. A polymer that is photo curable by UV-radiation may be PVA-SbQ prepared by introducing a stilbazolium group to PVA, polyethylene glycol diacrylate, and/or the like. That is, the nanofiber 21 and 22 may be formed of a water-insoluble polymer that is obtained by thermally curing or photo curing the water-soluble polymer.

The nanofiber core 21 may further include an elastic binder. The elastic binder may include natural rubber, styrene butadiene rubber, polybutadiene rubber, chloroprene rubber, acrylonitrile butadiene rubber (NBR), isobutylene isoprene rubber, ethylene propylene diene rubber (DPDM), chlorosulphonated polyethylene, acrylic elastomer, fluoro elastomer, silicone elastomer, and/or polyurethane.

The nanofiber core 21 and the nanofiber shell 22 may include a conductive material such as a nano metal particle, an ionic liquid, and/or an ionomer, respectively.

The nano metal particle may be a nano particle of one selected from the group consisting of gold (Au), silver (Ag), copper (Cu), palladium (Pd), platinum (Pt), Ag/Pd, and aluminum (Al). The nano metal particle may have a particle size in the range of about 5 to about 10 nm.

A cation of the ionic liquid may be substituted or unsubstituted imidazolium, pyrazolium, triazolium, thiazolium, oxazolium, pyridazinium, pyrimidinium, pyrazinium, ammonium, phosphonium, guanidinium, euronium, thioeuronium, pyridinium, or pyrrollium.

The anion may be any organic or inorganic anion that binds to the cation to form the ionic liquid. For example, the anion may include at least one selected from the group consisting of a halide anion, a borate anion, a phosphate anion, a phosphinate anion, an imide anion, a sulphonate anion, an acetate anion, a sulfate anion, a cyanate anion, a thiocyanate anion, a carbonaceous anion, a complex anion, and $ClO_4-$.

Examples of the anion include at least one selected from the group consisting of $PF_6^-$, $BF_4^-$, $B(C_2O_4)^-$, $CH_3(C_6H_5)SO_3^-$, $(CF_3CF_2)_2PO_2^-$, $CF_3SO_3^-$, $CH_3SO_4^-$, $CH_3(CH_2)_7SO_4^-$, $N(CF_3SO_2)_2^-$, $N(C_2F_5SO_2)_2^-$, $C(CF_2SO_2)_3^-$, $AsF_6^-$, $SbF_6^-$, $AlCl_4^-$, $NbF_6^-$, $HSO_4^-$, $ClO_4^-$, $CH_3SO_3^-$, and $CF_3CO_2^-$.

The ionomer may include an ethylene acrylic acid copolymer, a polyurethane ionomer having a polytrimethylene oxide bond, and an α-olefin copolymer ionomer having ethylene, propylene, 1-butene, 1-pentene, 1-hexene, 1-heptene, 3-methyl-1-butene, or 4-methyl-1-pentene as α-olefin.

The amount of the ionic liquid or ionomer may be in the range of about 10 to about 70 parts by weight, for example, about 20 to about 60 parts by weight, based on 100 parts by weight of the nanofiber polymer.

The nanowires 23 of the nanofiber-nanowire composite 20 may be formed of a conductive metal oxide. For example, the nanowires 23 may be formed of zinc oxide (ZnO), tin-dioxide ($SnO_2$), titanium dioxide ($TiO_2$), and/or indium oxide ($In_2O_3$).

The nanofiber 25 may have a diameter in the range of about 100 nm to about 5 μm, and a length of equal to or greater than 1 μm. The nanofiber core 21 may have a diameter in the range of about 0.1 nm to about 4 μm, and the nanofiber shell 22 may have a thickness in the range of about 0.1 nm to 3 5 μm.

The nanowire 23 may have a diameter in the range of about 100 nm to about 5 μm, and a length in the range of about 0.1 to about 5 μm.

Since the nanofiber-nanowire composite 20 has a core-shell structure, hydrophilicity or bandgaps may be efficiently adjusted by reforming the surface of the nanofiber shell 22 and/or selecting materials of nanofiber core 21 and nanofiber shell 23.

In FIGS. 2A and 2B, the nanofiber 25 has a core-shell structure. However, the nanofiber core 21 and shell 22 may be a gradient nanofiber having a composition gradient in the lengthwise direction or thicknesswise direction of the nanofiber core 21 and shell 22.

Figure 3:
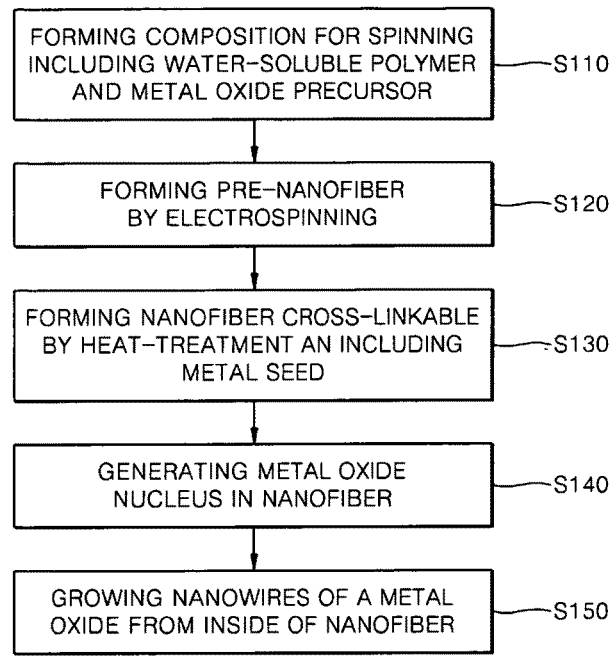
FIG. 3 is a flowchart illustrating a method of fabricating a nanofiber-nanowire composite, according to example embodiments.

FIG. 3 is a flowchart illustrating a method of fabricating a nanofiber-nanowire composite, according to example embodiments.

First, a composition including a water-soluble polymer, a metal oxide precursor, and a solvent is prepared in operation S110. A pre-nanofiber including the metal oxide precursor is formed by electrospinning the composition in operation S120.

The pre-nanofiber may have a core-shell structure using an electrospinning device including a spinning tip having a double nozzle, for example, a concentric nozzle, in the electrospinning. In other words, for example, the pre-nanofiber (now shown) having a core-shell structure may be prepared by emitting the first polymer via an inner nozzle and the second polymer via an outer nozzle.

The water-soluble polymer may be any polymer that may be cross-linked by heat-treatment or UV-radiation and converted into a water-insoluble polymer.

A water-soluble polymer that is thermally curable may be polyvinyl alcohol (PVA), polyacrylic acid (PAA), polystyrene sulfonic acid, polyhydroxyethyl methacrylate, polyethylene oxide (PEO), polyvinyl pyrrolidone (PVP), polyacrylamide (PA), and/or the like. The water-soluble polymer that is thermally curable may also be a block copolymer such as PVA-PEO-PVA, PVA-poly propylene oxide (PPO)-PVA, PVA-PA, PVA-PA-PAA, PVA-polystyrene (PS)-PVA, and/or PVA-PVA.

Additionally, the water-soluble polymer that is thermally cured to become a water-insoluble polymer may be carboxy methyl cellulose, methyl cellulose, hydroxy ethyl cellulose, dextrine, and/or the like.

A polymer that is photo curable by UV-radiation may be PVA-SbQ prepared by introducing a stilbazolium group to PVA, polyethylene glycol diacrylate, and/or the like.

The solvent may be water. Water may be used with a hydrophilic polymer or a polar solvent such as alcohol and dimethyl formaldehyde, which have high affinity to water.

The metal oxide precursor contained in the composition for electrospinning may be a nitride, chloride, sulfide, acetate, acetylacetonate, cyanate, isopropyl oxide, or butoxide of zinc (Zn), tin (Sn), titanium (Ti), and/or indium (In).

The composition for electrospinning may further include a cross-linking agent such as formaldehyde, glyoxal, glutadialdehyde, and/or the like.

Meanwhile, the composition for electrospinning may further include an elastic binder. The elastic binder may include at least one selected from the group consisting of a polymer elastomer such as natural rubber, styrene butadiene rubber, polybutadiene rubber, chioroprene rubber, acrylonitrile butadiene rubber (NBR), isobutylene isoprene rubber, ethylene propylene diene rubber (DPDM), chlorosulphonated polyethylene, acrylic elastomer, fluoro elastomer, silicone elastomer or polyurethane, and foam.

In addition, the composition for electrospinning may include a conductive material such as a nano metal particle, an ionic liquid, and/or an ionomer. The conductive material may function as a seed of the metal oxide with the metal oxide precursor.

The nano metal particle may be a nano particle of one metal selected from the group consisting of gold (Au), silver (Ag), copper (Cu), palladium (Pd), platinum (Pt), Ag/Pd, and aluminum (Al). The nano metal particle may have a particle size in the range of about 5 to about 10 nm and may be introduced into the composition for electrospinning in a colloidal solution or a nanoparticulate form. The amount of the nano metal particle may be in the range of about 10 to about 70 parts by weight, for example, about 20 to about 60 parts by weight, based on 100 parts by weight of the nanofiber polymer.

A cation of the ionic liquid may be substituted or unsubstituted imidazolium, pyrazolium, triazolium, thiazolium, oxazolium, pyridazinium, pyrimidinium, pyrazinium, ammonium, phosphonium, guanidinium, euronium, thioeuronium, pyridinium, and/or pyrrollium.

The anion may be any organic or inorganic anion that binds to the cation to form the ionic liquid. For example, the anion may include at least one selected from the group consisting of a halide anion, a borate anion, a phosphate anion, a phosphinate anion, an imide anion, a sulphonate anion, an acetate anion, a sulfate anion, a cyanate anion, a thiocyanate anion, a carbonaceous anion, a complex anion, and $ClO_4^-$.

Examples of the anion include at least one selected from the group consisting of $PF_6^-$, $BF_4^-$, $B(C_2O_4)^-$, $CH_3(C_6H_5)SO_3^-$, $(CF_3CF_2)_2PO_2^-$, $CF_3SO_3^-$, $CH_3SO_4^-$, $CH_3(CH_2)_7SO_4^-$, $N(CF_3SO_2)_2^-$, $N(C_2F_5SO_2)_2^-$, $C(CF_2SO_2)_3^-$, $AsF_6^-$, $SbF_6^-$, $AlCl_4^-$, $NbF_6^-$, $HSO_4^-$, $ClO_4^-$, $CH_3SO_3^-$, and $CF_3CO_2^-$.

The ionomer may include an ethylene acrylic acid copolymer, a polyurethane ionomer having a polytrimethylene oxide bond, and an α-olefin copolymer ionomer having ethylene, propylene, 1-butene, 1-pentene, 1-hexene, 1-heptene, 3-methyl-1-butene, or 4-methyl-1-pentene as α-olefin.

The amount of the ionic liquid or ionomer may be in the range of about 10 to about 70 parts by weight, for example, about 20 to about 60 parts by weight, based on 100 parts by weight of the nanofiber polymer.

When the composition is electrospun, a pre-nanofiber including the water-soluble polymer and the metal oxide precursor or a pre-nanofiber including the water-soluble polymer, the metal oxide precursor, and the elastic binder or the conductive material may be formed.

The electrospun pre-nanofiber is thermally cured to form a nanofiber including cross-linked water-soluble polymer in operation S130. The pre-nanofiber may be thermally cured by hot-air heating at a temperature in the range of about 100 to about 140° C . The water-soluble polymer of the nanofiber 11 is cross-linked by thermal curing and converted into a water-insoluble polymer, and the nanofiber 11 includes a metal seed that grows to form the nanowire of the metal oxide.

Alternatively, the electrospun pre-nanofiber may be prepared by UV-radiation using PVA-SbQ, polyethylene glycol diacrylate, and/or the like.

Figure 4:
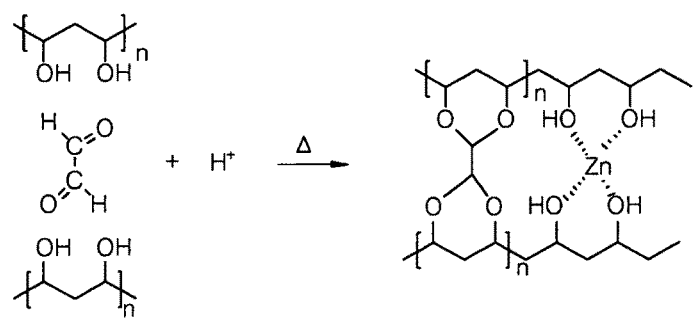
FIG. 4 schematically shows a process of converting a water-soluble polymer into a water-insoluble polymer including a metal seed by cross-linking the water-soluble polymer in the presence of a precursor of a metal oxide according to example embodiments.

FIG. 4 schematically shows a process of converting a water-soluble polymer (PVA) into a water-insoluble polymer including a metal seed by cross-linking the water-soluble polymer in the presence of a cross-linking agent and a metal oxide precursor, according to example embodiments. Referring to FIG. 4, in the cross-linked polymer, a metal atom is bound to portions that are not cross-linked via hydrogen bonds to form a metal seed.

The nanofiber including the metal seed is immersed in a solution including a compound that may form a nucleus of a metal oxide, and the solution is maintained at about 90° C. to grow the nucleus of the metal oxide from the metal seed in the nanofiber in operation S140.

A metal oxide precursor solution is added to the solution including the nanofiber in which the nucleus of the metal oxide is formed to grow nanowires of the metal oxide from the nucleus of the metal oxide of the nanofiber in operation S150.

Figure 5:
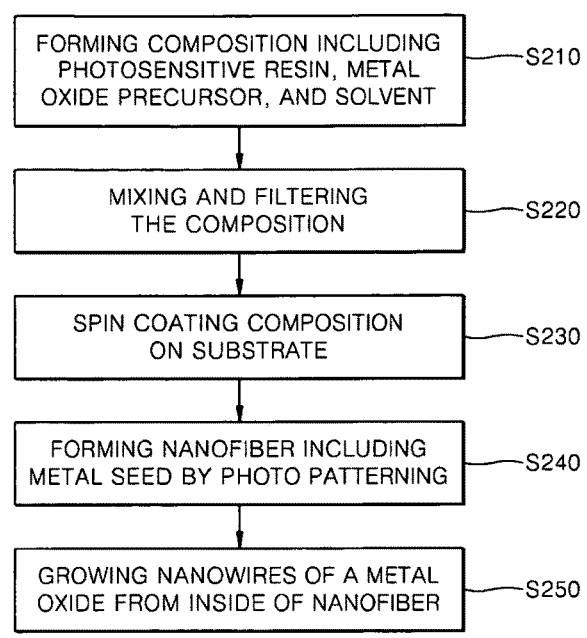
FIG. 5 is a flowchart illustrating a method of fabricating a nanofiber-nanowire composite, according to example embodiments.

FIG. 5 is a flowchart illustrating a method of fabricating a nanofiber-nanowire composite, according to example embodiments. The nanofiber is prepared by photo-patterning instead of electrospinning, and the nanowires are prepared in the same manner as in the preparation of the nanofiber-nanowire composite described above with reference to FIG. 4.

First, a composition including a photosensitive resin, a metal oxide precursor, and a solvent is prepared in operation S210. The photosensitive resin may be, for example, a multi-functional epoxy resin. The composition may further include any material that may be a seed of the metal oxide in addition to the metal oxide precursor.

The solvent may be an organic solvent. Then, the composition is mixed and filtered in operation S220. Elements of the composition may be sufficiently mixed by an ultrasonic treatment. After mixing the composition, materials insoluble in the composition are filtered using a micron syringe filter.

The mixed and filtered composition is spin-coated on a substrate to form a film in operation S230. The substrate may be a glass substrate, a plastic substrate, a semiconductor substrate, and/or the like. After the spin coating, the solvent may be removed by drying and/or baking. The film formed by spin coating is exposed to light using a photomask having a pattern and developed to prepare a nanofiber in operation S240. Thus, a nanofiber corresponding to the pattern of the photomask may be formed. The nanofiber includes a metal seed that is formed from a metal oxide precursor or other seed materials.

The nanofiber including the metal seed is immersed in a solution including a compound that may form a nucleus of a metal oxide, and the solution is maintained at about 90° C. to grow the nucleus of the metal oxide from the metal seed in the nanofiber.

A metal oxide precursor solution is added to the solution including the nanofiber in which the nucleus of the metal oxide is formed to grow nanowires of the metal oxide from the nucleus of the metal oxide of the nanofiber in operation S250.

As described above, by using the wet process by which nanowires grow in an aqueous solution, a nanofiber-nanowire composite may be mass-produced at a low temperature. Furthermore, since the nanowires grow from the inside of the nanofiber, the nanofiber-nanowire composite may have improved durability.

EXAMPLE 1

A composition including 2 wt % of zinc acetate dissolved in a 7 wt % polyvinyl alcohol (PVA) aqueous solution and 3 wt % of glyoxal, as a cross-linking agent, was electrospun at a voltage of 15 kV, at a radiation distance of 5 cm, at room temperature. A nanofiber obtained by electrospinning the composition was thermally cured at 120° C. for 5 minutes.

The thermally cured nanofiber was subjected to hydrothermal reaction in an aqueous solution including 0.01 M hexamethyltetradiamine (HMTA, $(CH_2)_6N_4$) and 0.01 M zinc nitrate hexa hydrate ($Zn(NO_3)_2 \cdot 6H_2O$) at 90° C. to grow zinc oxide (ZnO) nanowires on the nanofiber.

A nucleus of zinc oxide (ZnO) is formed according to the following reaction schemes.

$$(CH_2)_6N_4 + 6H_2O \rightarrow 4NH_3 + 6HCHO \quad (1)$$

$$NH_3 + H_2O \rightarrow NH^{4+} + OH^- \quad (2)$$

$$Zn + 2NH_{4+} \rightarrow Zn^{2+} + 2NH_3 + H_2 \quad (3)$$

$$Zn^{2+} + 2OH^- \rightarrow ZnO(s) + H_2O \quad (4)$$

An ammonia aqueous solution ($NH_3$) is formed from HMTA as in reaction scheme (1), and an ammonium ion ($NH^{4+}$) is formed as in reaction scheme (2). The ammonium ion ($NH_{4+}$) reacts with Zn contained in the nanofiber to form $Zn^{2+}$ (3), and $Zn^{2+}$ reacts with $OH^-$ of scheme (2) to form ZnO(s).

Figure 6:
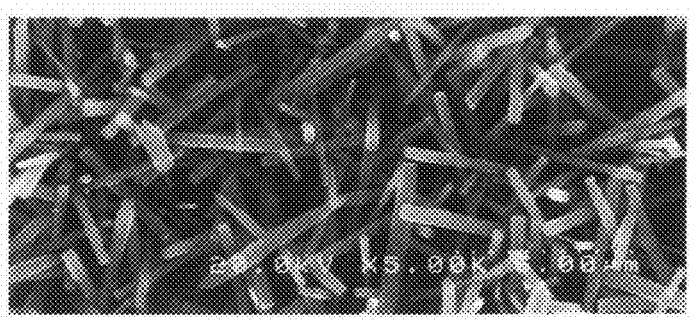
FIG. 6 is an electron microscope image of a nanofiber from which zinc oxide nanowires have grown (a nanofiber-nanowire composite), according to example embodiments.

FIG. 6 is an electron microscopic image of a nanofiber from which zinc oxide nanowires extend (a nanofiber-nanowire composite), according to example embodiments. Referring to FIG. 6, it is seen that the nanowires grow from the nanofiber. However, as will be understood, the nanowires may not always grow from the nanofiber at regular intervals and may not always be uniform in all dimensions as illustrated in the example embodiments of FIGS. 1A-2B. The nanowires may either grow in a uniform, symmetric fashion as illustrated in FIGS. 1A-2B, in a random, asymmetric fashion as shown in FIG. 6 or a nanofiber may include portion(s) wherein the nanowires grow in a uniform, symmetric fashion (FIGS. 1A-2B) and portion(s) wherein the nanowires grow in a random, asymmetric fashion (FIGS. 6).

EXAMPLE 2

A composition including 2 wt % of zinc acetate dissolved in a 7 wt % polyvinyl alcohol (PVA) aqueous solution and 3 wt % of glyoxal, as a cross-linking agent, was electrospun at a voltage of 15 kV, at a radiation distance of 5 cm, at room temperature. A nanofiber obtained by electrospinning the composition was thermally cured by hot-air heating at 120° C. for 5 minutes.

The thermally cured nanofiber was maintained at 60° C. for 30 minutes in a solution prepared by dissolving 3 g of zinc acetate in a solution including 10 g of deionized water and 10 g of methanol. Then, the solution was maintained at the same temperature for 3 hours while a solution prepared by dissolving 1 g of potassium hydroxide in 10 g of methanol was added into the solution, and further stirred for 5 hours while maintaining at the same temperature. An electron microscope illustrated that the nanofiber-nanowire composite obtained was somewhat similar to that obtained in Example 1.

EXAMPLE 3

A composition including 2 wt % of zinc acetate dissolved in a 10 wt % PVA-SbQ aqueous solution and 3 wt % of glyoxal, as a cross-linking agent, was electrospun at a voltage of 15 kV, at a radiation distance of 5 cm, at room temperature. A nanofiber obtained by electrospinning the composition was photo cured by UV radiation.

The photo cured nanofiber was subjected to hydrothermal reaction in an aqueous solution including 0.01 M hexamethyltetradiamine (HMTA) (($CH_2$)$_6$$N_4$) and 0.01 M zinc nitrate hexa hydrate ($Zn(NO_3)_2 \cdot 6H_2O$) at 90° C. to grow zinc oxide (ZnO) nanowires on the nanofiber. An electron microscope illustrated that the nanofiber-nanowire composite obtained was somewhat similar to that obtained in Example 1.

EXAMPLE 4

A composition including 2 wt % of zinc acetate dissolved in a 10 wt % polyethylene glycol diacrylate (PEG-DA, Aldrich) aqueous solution and 3 wt % of glyoxal, as a cross-linking agent, was electrospun at a voltage of 15 kV, at a radiation distance of 5 cm, at room temperature. A nanofiber obtained by electrospinning the composition was photo cured by UV radiation.

The photo cured nanofiber was subjected to hydrothermal reaction in an aqueous solution including 0.01 M hexamethyltetradiamine (HMTA) (($CH_2$)$_6$$N_4$) and 0.01 M zinc nitrate hexa hydrate ($Zn(NO_3)_2 \cdot 6H_2O$) at 90° C. to grow zinc oxide (ZnO) nanowires on the nanofiber. An electron microscope illustrated that the nanofiber-nanowire composite obtained was somewhat similar to that obtained in Example 1.

EXAMPLE 5

A colloidal solution including 10 wt % polyethylene glycol diacrylate (PEG-DA, Aldrich) and 3 wt % Ag/Pd solution having a diameter in the range of 5 to 10 nm was sonicated for 30 minutes, 2 wt % of zinc acetate was dissolved therein, and 3 wt % of glyoxal, as a cross-linking agent, was added thereto to prepare a composition. The composition was electrospun at a voltage of 15 kV, at a radiation distance of 5 cm, at room temperature. A nanofiber obtained by electrospinning the composition was photo cured by UV radiation.

The photo cured nanofiber was subjected to hydrothermal reaction in an aqueous solution including 0.01 M hexamethyltetradiamine (HMTA) (($CH_2$)$_6$$N_4$) and 0.01 M zinc nitrate hexa hydrate ($Zn(NO_3)_2 \cdot 6H_2O$) at 90° C. to grow zinc oxide (ZnO) nanowires on the nanofiber. An electron microscope illustrated that the nanofiber-nanowire composite obtained was somewhat similar to that obtained in Example 1.

EXAMPLE 6

A composition for forming a photosensitive polymer complex including 3 g of a multi-functional epoxy resin (SU-8, Hexion specialty Co.), 1 g of cyclopentanone, as an organic solvent, and 0.05 g of silvertrifluoro acetate (Aldrich) was prepared. The composition was sonicated for 1 hour to sufficiently mix the elements, and filtered using a 0.5 micron syringe filter. The filtered composition was spin coated on a glass substrate surface-treated with $CF_4$ Plasma at a rate of 2000 rpm and dried at 100° C. for 1 minute to remove the organic solvent remaining on the surface of the coating.

A film prepared by the spin coating was exposed to UV rays at 100 mJ/cm$^2$ for 12 seconds using a photomask with a pattern having a size of 3 um, dried at 100° C. for 1 minute, and immersed in 2-methoxyethanol for 20 seconds to be developed. The developed film was baked at 200° C. for 1 minute to align a photosensitive nanofiber having a negative pattern with nanoparticles.

The photo cured nanofiber was subjected to hydrothermal reaction in an aqueous solution including 0.01 M hexamethyltetradiamine (HMTA) (($CH_2$)$_6$$N_4$) and 0.01 M zinc nitrate hexa hydrate ($Zn(NO_3)_2 \cdot 6H_2O$) at 90° C. to grow zinc oxide (ZnO) nanowires on the nanofiber. An electron microscope illustrated that the nanofiber-nanowire composite obtained was somewhat similar to that obtained in Example 1.

The nanofiber-nanowire composite may be used in an elastic electrode, a wearable electrode, an elastic thin film transistor, an elastic display/device/sensor, and/or the like. Since the nanowires are rigidly fixed to the inside of the nanofiber, the nanofiber-nanowire composite may have improved durability and high reliability.

As described above, according to example embodiments, since the nanowires of a metal oxide are formed on the elastic nanofiber, the nanofiber-nanowire composite may have a wider specific surface area.

In addition, since the nanowires grow from the inside to the outside of the nanofiber, the nanowires are rigidly fixed to the nanofiber and improve durability of the nanofiber-nanowire composite.

Furthermore, since the nanowires grow from the nanofiber by using the wet process, a nanofiber-nanowire composite having a large area may be prepared at a low temperature.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A nanofiber-nanowire composite consisting of:
   a polymer nanofiber which is a nanofiber consisting of a polymer, and a plurality of nanowires of a metal oxide extending from the inside of the polymer nanofiber to the outside of the polymer nanofiber and covering the polymer nanofiber.

2. The nanofiber-nanowire composite of claim 1, wherein the polymer nanofiber comprises a water-insoluble polymer.

3. The nanofiber-nanowire composite of claim 2, wherein the water-insoluble polymer is prepared by cross-linking a water-soluble polymer.

4. The nanofiber-nanowire composite of claim 2, wherein the water-insoluble polymer is a photosensitive polymer including an epoxy resin.

5. The nanofiber-nanowire composite of claim 3, wherein the water-soluble polymer comprises at least one selected from a group consisting of polyvinyl alcohol (PVA), polyacrylic acid (PAA), polystyrene sulfonic acid, polyhydroxyethyl methacrylate, polyethylene oxide (PEO), polyvinyl pyrolidone (PVP), polyacrylamide (PA), PVA-PEO-PVA, PVA-poly propylene oxide (PPO)-PVA, PVA-PA, PVA-PA-PAA, PVA-polystyrene (PS) -PVA, and PVA-PVA, PVA-SbQ prepared by introducing a stilbazolium group to PVA, and polyethylene glycol diacrylate.

6. The nanofiber-nanowire composite of claim 1, wherein the metal oxide comprises zinc oxide (ZnO), tin-dioxide ($SnO_2$), titanium dioxide ($TiO_2$), or indium oxide ($In_2O_3$).

7. A method of fabricating a nanofiber-nanowire composite consisting of a polymer nanofiber, the method comprising:
    forming the polymer nanofiber which is a nanofiber consisting of a polymer, and a plurality of nanowires of a metal oxide,
    the plurality of nanowires being grown from a metal seed to the outside of the polymer nanofiber such that the plurality of nanowires extend from the inside of the polymer nanofiber to the outside of the polymer nanofiber and cover the polymer nanofiber.

8. The method of claim 7, wherein forming the polymer nanofiber comprises:
    forming a polymer film by spin coating a composition including a photosensitive polymer, a precursor of the metal oxide, and a solvent; and
    patterning the polymer nanofiber by exposing the polymer film to light using a photomask and developing the polymer film.

9. The method of claim 7, wherein forming the polymer nanofiber comprises:
    forming a pre-nanofiber by electrospinning a composition including a water-soluble polymer, a first precursor of the metal oxide, and a solvent; and
    converting the water-soluble polymer in the pre-nanofiber into a water-insoluble polymer by cross-linking the water-soluble polymer.

10. The method of claim 9, wherein the water-soluble polymer is cross-linked by heat-treatment.

11. The method of claim 9, wherein the water-soluble polymer is cross-linked by UV-radiation.

12. The method of claim 7, wherein growing the nanowires of the metal oxide includes immersing the polymer nanofiber in a hexamethyltetradiamine (HMTA, $(CH_2)_6N_4$) solution.

13. The method of claim 12, wherein growing the nanowires of the metal oxide further includes adding a second precursor of the metal oxide to the HMTA solution in which the polymer nanofiber is immersed.

14. The method of claim 12, wherein growing the nanowires of the metal oxide comprises:
    heating the polymer nanofiber in a mixed solution including zinc acetate, deionized water, and methanol; and
    adding a solution including potassium hydroxide and methanol into the mixed solution.

15. The method of claim 8, wherein the composition further includes a conductive material.

16. The method of claim 7, wherein the metal oxide includes zinc oxide (ZnO), tin-dioxide ($SnO_2$), titanium dioxide ($TiO_2$), or indium oxide ($In_2O_3$).

17. The nanofiber-nanowire composite of claim 1, wherein the polymer nanofiber has a hydrophobic surface.

* * * * *